United States Patent
Okubo

(12) 
(10) Patent No.: US 6,566,658 B1
(45) Date of Patent: May 20, 2003

(54) CHARGED PARTICLE BEAM CONTROL ELEMENT, METHOD OF FABRICATING CHARGED PARTICLE BEAM CONTROL ELEMENT, AND CHARGED BEAM APPARATUS

(75) Inventor: Yukiharu Okubo, Tokyo (JP)

(73) Assignee: Nikon Corporation, Tokyo (JP)

( * ) Notice: Subject to any disclaimer, the term of this patent is extended or adjusted under 35 U.S.C. 154(b) by 119 days.

(21) Appl. No.: 09/689,782

(22) Filed: Oct. 13, 2000

(30) Foreign Application Priority Data

Oct. 19, 1999 (JP) .......................................... 11-296842

(51) Int. Cl.[7] ................................................ H01J 37/12
(52) U.S. Cl. ............ 250/398; 250/396 R; 250/396 ML; 250/292; 250/492.2
(58) Field of Search ............................ 250/398, 396 R, 250/396 ML, 292, 492.2

(56) References Cited

U.S. PATENT DOCUMENTS 5,051,593 A * 9/1991 Ishihara .................. 250/396 R
5,838,011 A * 11/1998 Krijn et al. ............. 250/396 R
5,869,838 A * 2/1999 Stengl .................... 250/396 R

FOREIGN PATENT DOCUMENTS

JP          2-247966          10/1990

* cited by examiner

*Primary Examiner*—John R. Lee
*Assistant Examiner*—Zia R. Hashmi
(74) *Attorney, Agent, or Firm*—Oliff & Berridge PLC

(57) ABSTRACT

An object is to provide a charged particle beam control element that enables connection of voltage-applying wires with electrodes in simple structure while maintaining high accuracy of surfaces of the electrodes formed on an insulator by a surface treatment of plating or the like. A charged particle beam control element 10 according to the present invention is provided with a cylindrical base 11 having electrode portions 21 formed on an internal surface thereof, and insulating portions 15 which are disposed at locations not exposed to a passing area of a charged particle beam surrounded by the internal surface and which separate the electrode portions 21 from each other.

10 Claims, 12 Drawing Sheets

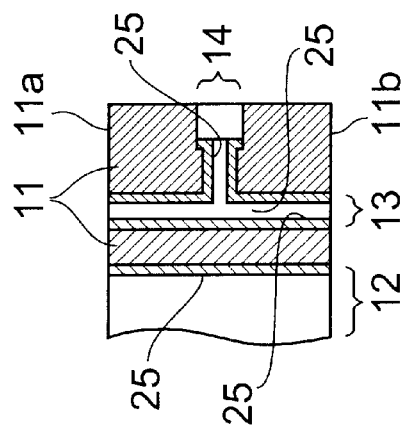
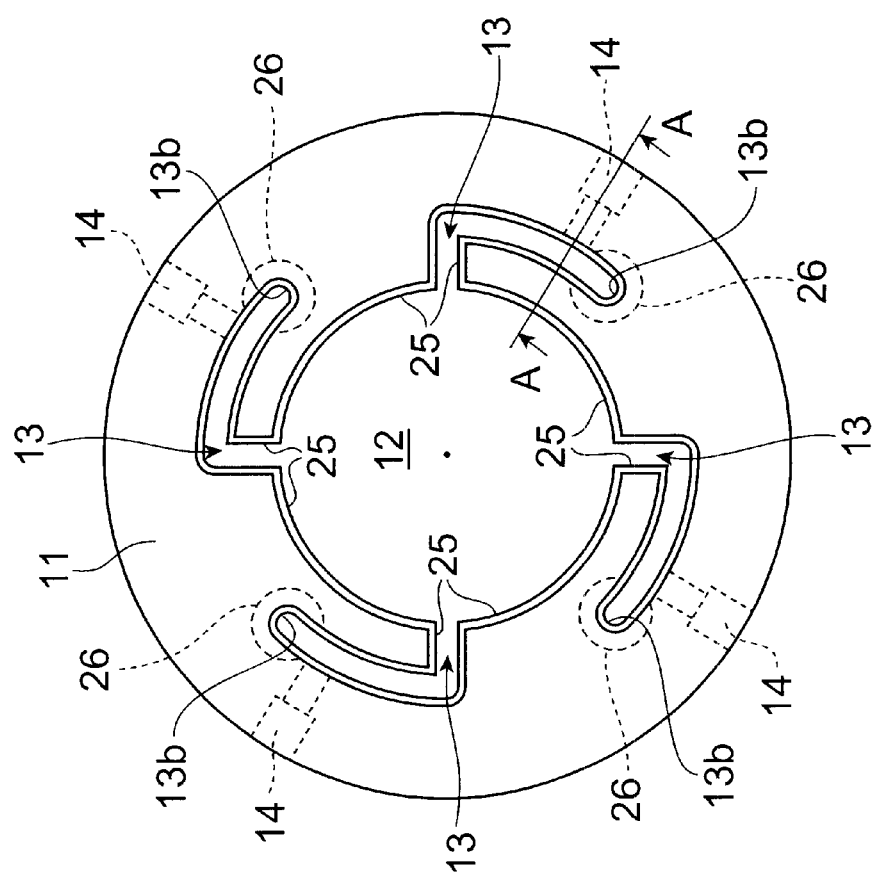

CHARGED PARTICLE BEAM CONTROL ELEMENT, METHOD OF FABRICATING CHARGED PARTICLE BEAM CONTROL ELEMENT, AND CHARGED BEAM APPARATUS

BACKGROUND OF THE INVENTION

The present invention relates to a charged particle beam control element for controlling a trajectory or a cross-sectional shape of a charged particle beam by an electrostatic field, a method of fabricating the charged particle beam control element, and a charged particle beam apparatus.

The conventionally well-known charged particle beam control elements for controlling the trajectory or the cross-sectional shape of the charged particle beam by the electrostatic field include electrostatic deflectors, electrostatic lenses, stigmators, and so on.

FIG. 11 is a top plan view to show a conventional electrostatic deflector 100. FIG. 12A is a figure to show an A—A cross section of FIG. 11 and FIG. 12B a figure to show a B—B cross section of FIG. 11.

The electrostatic deflector 100 has octupole metal electrodes 101 (see FIG. 11). Each of the metal electrodes 101 is fixed to the inside of an insulating sheath 102 with fixing screws 103, 104 (see FIG. 12A). A voltage-applying wire 105 to each metal electrode 101 is directly fixed to the corresponding metal electrode 101 with a wiring screw 106 (see FIG. 12B).

In this electrostatic deflector 100, an electrostatic field is established according to voltages applied to the respective metal electrodes 101 inside a space 107 surrounded by internal surfaces 101a of the respective metal electrodes 101. Accordingly, the charged particle beam passing along the center axis Z in the space 107 is deflected according to the electrostatic field established in the space 107.

Each of clearances 108 between adjacent metal electrodes 101 is not of the shape of a straight line, but of the shape bent twice and then reaching the insulating sheath 102. This is for the purpose of keeping exposed portions 109 of the insulating sheath 102 off direct view from the charged particle beam passing the space 107. This structure prevents charge-up of the insulating sheath 102 and allows the electrostatic field in the space 107 to be precisely controlled by the voltages applied to the respective metal electrodes 101.

SUMMARY OF THE INVENTION

The above electrostatic deflector 100, however, had the problems of the complex structure, the large number of components, and difficulties in reduction of cost and size.

The octupole metal electrodes 101 constituting the electrostatic deflector 100 are constructed by first screwing a metal cylinder to the inside of the insulating sheath 102 and dividing the cylinder into the electrodes. For this reason, it was difficult to enhance dividing angle accuracy of the metal electrodes 101. For the same reason, it was also difficult to enhance the circularity of the space 107 surrounded by the internal surfaces 101a of the metal electrodes 101.

Thus proposed recently was use of film electrodes deposited on an insulator by a surface treatment of plating or the like (plating electrodes) instead of the above metal electrodes 101 (for example, as described in Japanese Patent Application Laid-Open No. H02-247966). The electrostatic deflectors using the plating electrodes obviate the need for screwing of the electrodes, which can decrease the number of components and decrease the size.

In the electrostatic deflectors using the plating electrodes, if the voltage-applying wires are directly fixed to the plating electrodes by screwing as in the case of the conventional electrostatic deflector 100 described above, the surfaces of the plating electrodes can be perforated with holes. If the plating electrodes should have holes the electrostatic field distribution could be distorted in the space in which the charged particle beam passes, and it would result in failing to control deflection of the charged particle beam with high accuracy.

For this reason, the electrostatic deflector disclosed in the application Laid-Open No. H02-247966 is constructed to prevent the surfaces of the plating electrodes from being perforated in such a manner that support portions of an insulator with the plating electrodes formed thereon are projected out, together with the plating electrodes, from an end of the insulating sheath and that the voltage-applying wires are connected to the projecting portions. However, this wiring structure was complex and there was the possibility that coatings (insulator) of the voltage-applying wires connected to the projecting portions could be viewed through clearances between adjacent plating electrodes.

There were also desires for construction using the plating electrodes in the other charged particle beam control elements (such as the electrostatic lenses and the like) as well as the aforementioned electrostatic deflectors. Under such circumstances, there were desires for some idea about how to connect the voltage-applying wires to the plating electrodes.

An object of the present invention is to provide a charged particle beam control element enabling the connection of the voltage-applying wires to the electrodes in simple structure while maintaining the surfaces of the electrodes formed on the insulator by the surface treatment of plating or the like with high accuracy, a method of fabricating the charged particle beam control element, and a charged particle beam apparatus.

A charged particle beam control element according to the present invention is a charged particle beam control element for controlling a trajectory of a charged particle beam by an electrostatic field, which comprises: a cylindrical base having a plurality of electrode portions formed on an internal surface thereof; and insulating portions, which are disposed at respective locations not exposed to a passing area of the charged particle beam surrounded by the internal surface, separate the electrode portions from each other.

Since the plurality of electrode portions formed on the internal surface are separated from each other by the insulating portions in this way, the internal surface defining the passing area of the charged particle beam can be readily machined in any desired shape. Since the insulating portions are not exposed to the passing area of the charged particle beam, the charged particle beam can be controlled more accurately without charging the insulating portions up by the charged particle beam.

The above charged particle beam control element may also be so configured that a plurality of grooves extending from one end to the other end of the base are formed on the internal surface and that a cross-sectional shape of each groove is bent and each insulating portion is formed in a deepest area of the groove.

When the insulating portions are formed in the grooves extending from one end to the other end of the base in this way, the electrode portions formed on the internal surface can be separated from each other. When the insulating portion is formed in the deepest area of each bent groove, the insulating portion can be kept from being exposed to the passing area of the charged particle beam.

The above charged particle beam control element may also be so configured that a through hole is formed so as to penetrate the base between a peripheral surface of the base and each groove and that an electroconductive portion is formed on an internal surface of the through hole.

When the conductive portion is formed on the internal surface of the through hole penetrating the base from the peripheral surface to the groove, it becomes unnecessary to form the conductive portion on the internal surface defining the passing area of the charged particle beam and thus it becomes feasible to keep the internal surface smooth. When the through hole is used as a screw hole for fixing the base, the structure of the charged particle beam control element can be simplified.

The above charged particle beam control element may also be so configured that the through hole is not exposed to the passing area of the charged particle beam.

When the through hole is formed so as not to be exposed to the passing area of the charged particle beam in this way, it becomes feasible to weaken the effect of electric current flowing in the conductive portion on the passing area of the charged particle beam.

A fabrication method of a charged particle beam control element according to the present invention is a method of fabricating a charged particle beam control element for controlling a trajectory of a charged particle beam by an electrostatic field, the method comprising: a groove forming step of forming on an internal surface of a cylindrical base, a groove extending from one end to the other end of the base and having a bent cross-sectional shape; a conductive member depositing step of depositing an electroconductive member on the internal surface including the groove; and an insulating portion forming step of forming an insulating portion by removing the electroconductive member deposited in a deepest area of the groove, from one end toward the other end of the base.

When the conductive member is deposited on the internal surface in the conductive member depositing step after the formation of the groove in the base in the groove forming step as described above, the electrode portion and the conductive portion can be formed readily. Then the electrode portion can be separated into plural regions by removing the conductive member deposited in the deepest area of the groove in the insulating portion forming step.

The above charged particle beam control element fabrication method may also be arranged to further comprise a conductive member grinding step of grinding a surface of the electroconductive member deposited on the internal surface so that the cross-sectional shape of the internal surface becomes complete round, after the conductive member depositing step.

When the surface of the electroconductive member is ground after the deposition of the electroconductive member in this way, the internal surface defining the passing area of the charged particle beam can be made close to complete round.

The above charged particle beam control element fabrication method may also be arranged to further comprise a conductive member grinding step of grinding a surface of the electroconductive member deposited on the groove in order to adjust a position of an electrode portion, after the conductive member depositing step.

The position of the electrode portion can be adjusted by grinding the surface of the conductive member after the deposition of the conductive member in this way.

The above charged particle beam control element fabrication method is preferably arranged to further comprise a through hole forming step of forming a through hole penetrating the base between a peripheral surface of the base and the groove, between the groove forming step and the conductive member depositing step.

Another charged particle beam control element according to the present invention is a charged particle beam control element comprising: a cylindrical base having an electrode portion formed on an internal surface thereof; a first electroconductive member placed on an internal surface of a communicating hole formed so as to establish communication between one end of the base and a through hole for fixing the base, formed in a peripheral surface of the base; and a second electroconductive member placed on the one end of the base so as to connect the first electroconductive member with the electrode portion.

When the charged particle beam control element has the structure in which the communicating hole for establishing communication between the through hole and one end of the base is formed in the base and the element has the second conductive portion connecting the first conductive portion placed on the internal surface of the communicating hole with the electrode portion defining the passing area of the charged particle beam, the surface of the electrode portion (internal surface) can be kept smooth.

A charged particle beam apparatus according to the present invention comprises the above charged particle beam control element, and irradiation means for implementing irradiation with a charged particle beam controlled by the charged particle beam control element.

The charged particle beam apparatus having the above charged particle beam control element as described above can realize the charged particle beam apparatus of simple structure while keeping the surface of the electrode portions formed on the internal surface of the charged particle beam control element with high accuracy.

BRIEF DESCRIPTION OF THE DRAWINGS

FIG. 4A is a diagram to illustrate the fabrication process of the electrostatic deflector 10.

FIG. 4B is a diagram to illustrate the fabrication process of the electrostatic deflector 10.

DESCRIPTION OF THE PREFERRED EMBODIMENTS

The embodiments of the present invention will be described hereinafter in detail with reference to the drawings.

(First Embodiment)

First described is the charged particle beam control element according to the first embodiment of the present invention. The charged particle beam control element according to the first embodiment concerns an electrostatic element 10 that controls a trajectory of an electron beam to deflect the electron beam (hereinafter referred to as "electrostatic deflector").

The electrostatic deflector 10 is an electrostatic quadrupole deflector in which continuous electroconductive films 21 to 24 of an electric conductor are formed at four locations on an internal surface of a cylindrical member 11 (base) of an electric insulator.

Figure 1:
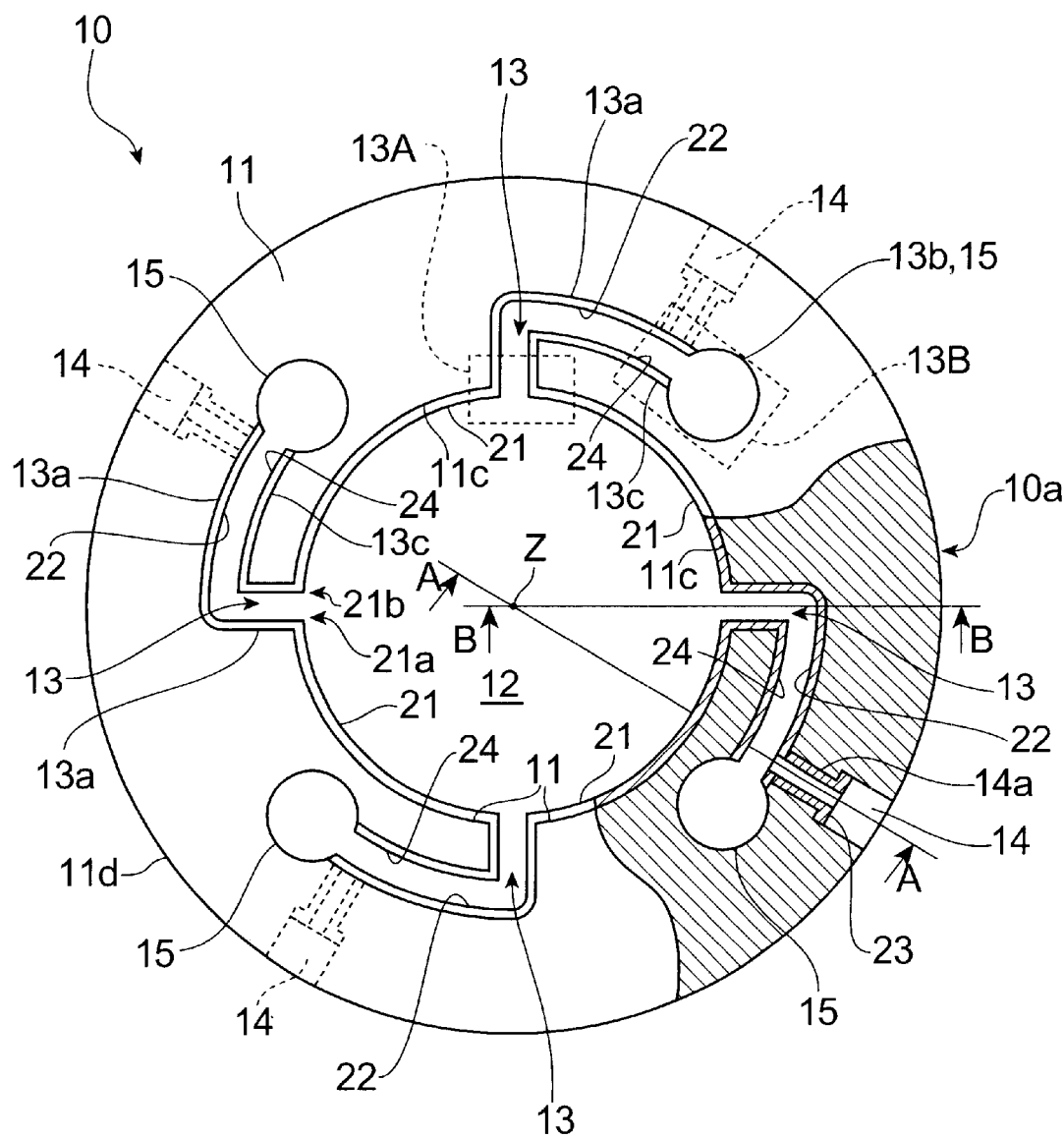
FIG. 1 is a top plan view of the electrostatic deflector 10 in the first embodiment.
Figure 2A:
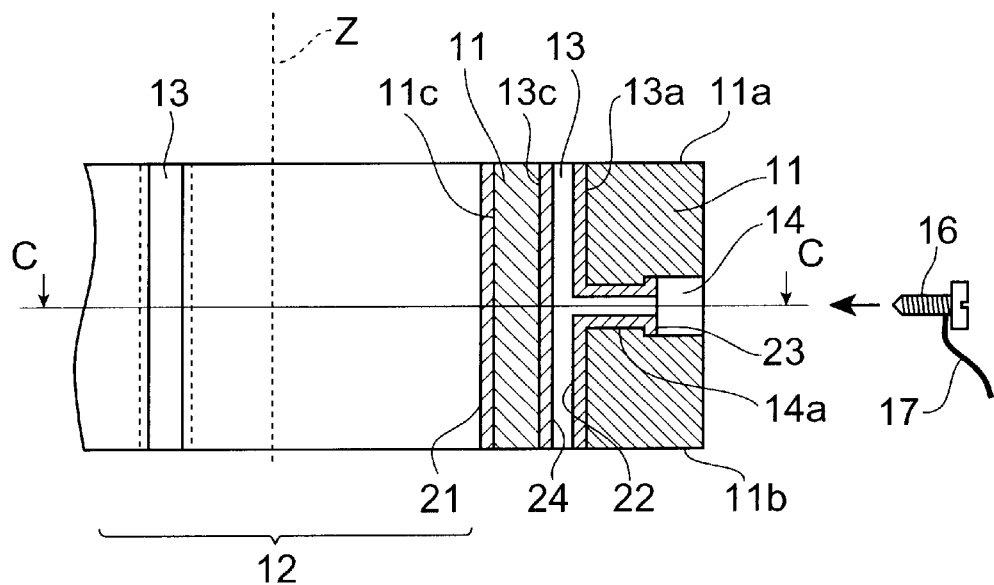
FIG. 2A is an A—A cross-sectional view of the electrostatic deflector 10 illustrated in FIG. 1.
Figure 2B:
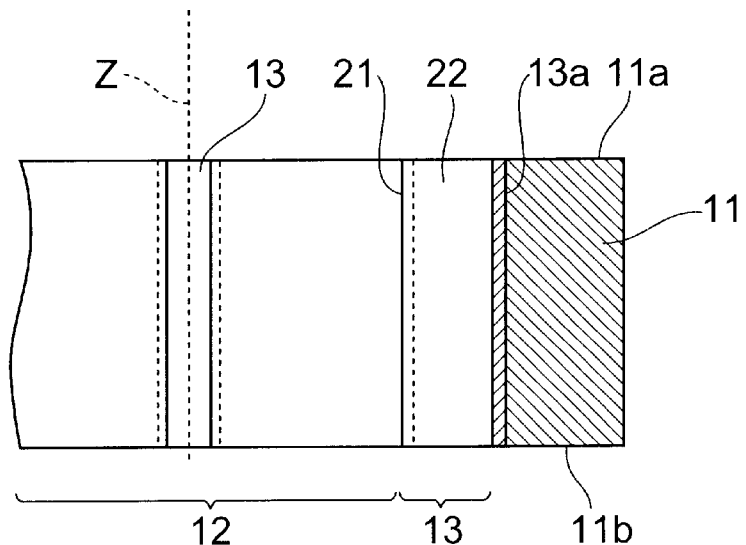
FIG. 2B is a B—B cross-sectional view of the electrostatic deflector 10 illustrated in FIG. 1.

Specific structure of the cylindrical member 11 and arrangement of the conductive films 21 to 24 will be described referring to FIG. 1 and FIG. 2. FIG. 1 is a top plan view to show the electrostatic deflector 10. A portion 10a of the electrostatic deflector 10 is illustrated as a cross-sectional view in FIG. 1. FIG. 2A is an A—A cross section of FIG. 1 and FIG. 2B a B—B cross section of FIG. 1. The portion 10a of FIG. 1 corresponds to a C—C cross section of FIG. 2A.

Here the cylindrical member 11 is provided with an aperture 12 of a circular cross section and four bent grooves 13 (channels) of an L-shaped cross section. The aperture 12 and each bent groove 13 penetrate the member 11 along the center axis Z between one end face 11a and the other end face 11b of the cylindrical member 11 (see FIG. 2A). The aperture 12 is equivalent to the space surrounded by the internal surface 11c of the cylindrical member 11, or is the passing area of the charged particle beam.

The four bent grooves 13 are arranged at intervals of 90° around the aperture 12 and are in communication with the aperture 12 on the side of one end 13A thereof. The communicating portions divide the internal surface 11c of the cylindrical member 11 into four areas. The other end side 13B of each bent groove 13 is located in a region not exposed to the aperture 12. The "region not exposed to the aperture 12" herein means an area that is kept off direct view from the electron beam passing along the center axis Z in the aperture 12.

Further, a screw hole 14 (through hole) is bored per bent groove 13 in the cylindrical member 11 so that it penetrates the inside of the cylindrical member 11 radially from the other end side 13B of each bent groove 13 to the outer surface 11d. A communicating portion between each bent groove 13 and each screw hole 14 is located in the area off direct view from the electron beam passing the aperture 12.

In the cylindrical member 11 of the above structure, the inside surface thereof is composed of the internal surface 11c defining the aperture 12, the internal surfaces 13a, 13b, 13c of each bent groove 13, and the internal surfaces 14a of each screw hole 14.

The internal surface 13b located in the deepest area of each bent groove 13 out of these internal surfaces 11c, 13a to 13c, 14a is located in the area kept off direct view from the electron beam passing the aperture 12. This internal surface 13b is an insulating portion 15 which is an exposed portion of the insulator of the cylindrical member 11. The other internal surfaces 11c, 13a, 13c, 14a are uniformly covered with the continuous conductive films 21 to 24.

The insulating portions 15 extend along the center axis Z of the cylindrical member 11 from one end face 11a to the other end face 11b of the cylindrical member 11. Therefore, the continuous conductive films 21 to 24 are electrically isolated from the other adjacent conductive films 21 to 24 by the insulating portions 15 of the respective bent grooves 13.

Four sets of such continuous conductive films 21 to 24 are arranged at intervals of 90° on the internal surface of the cylindrical member 11.

The continuous conductive films 21 to 24 will be separately described herein for each of the internal surfaces 11c, 13a, 13c, 14a. The four conductive films 21 formed on the internal surface 11c are arranged to surround the aperture 12 and function as electrodes to establish the electrostatic field in the aperture 12. The conductive films 21 correspond to the "electrode portions" in the claims.

The conductive film 22 formed on the internal surface 13a so as to extend from one end 21a of each conductive film 21, functions as a wire for applying a voltage to the conductive film 21. This conductive film 22 includes an area under direct view and an area off direct view from the electron beam passing the aperture 12.

Further, the conductive film 23 formed on the internal surface 14a so as to extend from the area of each conductive film 22 off direct view from the electron beam, functions as a wire for applying the voltage to the above-described conductive film 21 as the conductive film 22 does.

The conductive film 24 formed on the internal surface 13c so as to extend from the other end 21b of each conductive film 21 described above, and the above conductive films 21, 22 extend along the center axis Z of the cylindrical member 11 from the end face 11a to the end face 11b of the cylindrical member 11.

Figure 3B:
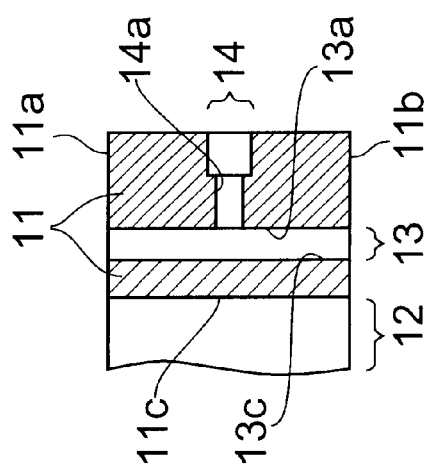
FIG. 3B is a diagram to illustrate the fabrication process of the electrostatic deflector 10.
Figure 3A:
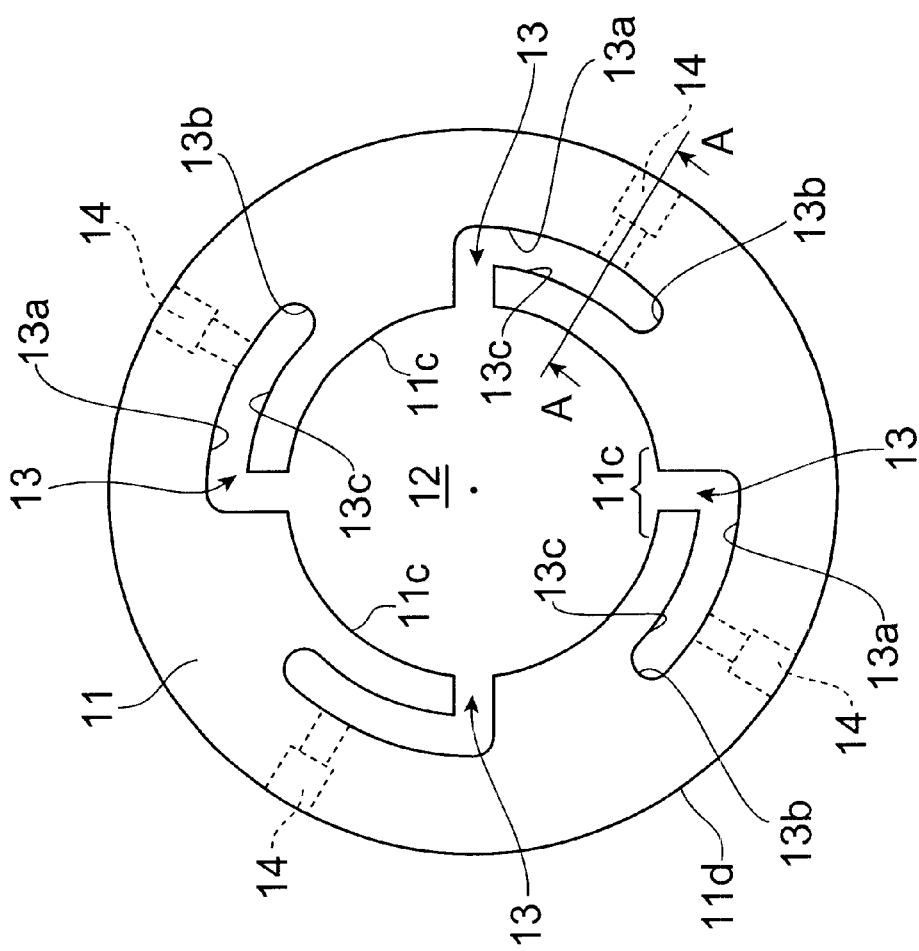
FIG. 3A is a diagram to illustrate the fabrication process of the electrostatic deflector 10.

Next, a method of fabricating a charged particle beam control element according to the first embodiment will be described specifically for the above electrostatic deflector 10. In the first step, a solid ceramic insulator is formed in the shape illustrated in FIG. 3A and FIG. 3B and the formed ceramic insulator is baked (blank working). This step results in obtaining the cylindrical member 11 provided with the aperture 12, the four bent grooves 13, and the four screw holes 14.

Then the internal surface of the cylindrical member 11 of the above structure is treated by the surface treatment of electroless plating. For example, electroless nickel plating is placed as an undercoat on the internal surface, or electroless gold plating may be directly placed on the internal surface. It is preferable to mask the outer surface 11d of the cylindrical member 11 during this surface treatment.

As a result of the surface treatment, a conductive film 25 is uniformly formed on the internal surface 11c of the cylindrical member 11, the internal surfaces 13a to 13c of the four bent grooves 13, and the internal surfaces 14a of the four screw holes 14 (see FIG. 4A and FIG. 4B).

Then the area near the deepest area 26 of each bent groove 13 is subjected to machining or electric discharge machining to remove the conductive film 25 formed there on the internal surface 13b. As a result, the internal surface 13b of each bent groove 13 turns to the insulating portion 15 (see FIG. 1), whereby the conductive film 25 is divided into the four electrodes electrically isolated from each other.

In this way the electrostatic quadrupole deflector (the electrostatic deflector 10 of the first embodiment) is obtained in the structure in which the continuous conductive films 21 to 24 are formed at the four locations on the internal surface of the cylindrical member 11. The formation of the insulating portions 15 may also be conducted by masking the internal surfaces 13b during the surface treatment.

In this electrostatic deflector 10, the conductive film 23 is formed on the internal surface 14a of each screw hole 14. Therefore, the voltage-applying wire 17 from the outside can be connected to the conductive film 23 by putting the wiring screw 16 (see FIG. 2A) into the corresponding screw hole 14 and tightening it. Namely, the voltage-applying wire 17 from the outside is connected through the conductive film 23 of the screw hole 14 and through the conductive film 22 of the bent groove 13 to the conductive film 21 on the internal surface 11c. When in this connection state predetermined voltages are applied to the conductive films 21 from the outside, a predetermined electrostatic field is established in the aperture 12.

As a consequence, the electron beam passing along the center axis Z in the aperture 12 is deflected by a predetermined distance in a predetermined direction according to the electrostatic field established in the aperture 12.

As described above, the electrostatic deflector 10 according to the first embodiment is simplified in the wiring structure to the conductive films 21 for the electrodes, because the conductive films 22 for wires are placed on the internal surfaces 13a of the bent grooves 13 and the conductive films 23 for wires on the internal surfaces 14a of the screw holes 14 (inside the cylindrical member 11).

There is no need for provision of an extra space for the wiring structure to the conductive films 21, so that the electrostatic deflector 10 can be constructed in reduced size.

The fastening with the wiring screw 16 permits easy establishment of electric conduction between the voltage-applying wire 17 and the conducive film 21 for electrode. This arrangement also makes it free to attach or detach the voltage-applying wire 17.

Further, since each conductive film 22 for wire is connected to one end 21a of the conductive film 21 for electrode, the surfaces of the conductive films 21 for electrode are prevented from being perforated, so that the surfaces are the conductive films 21 (electrode surfaces) can be maintained with high accuracy. Accordingly, the highly accurate electrostatic field without distortion can be formed in the aperture 12.

Since each communicating portion between screw hole 14 and bent groove 13 (the connecting portion between conductive film 23 and conductive film 22) is located in the area off direct view from the electron beam passing the aperture 12, the electrostatic field can be established with higher accuracy in the aperture 12.

Further, since the electrostatic deflector 10 is constructed in the structure in which the insulating portions 15 are not exposed to the passing area of the charged particle beam, i.e., in the structure in which the insulating portions 15 are off direct view from the electron beam passing the aperture 12, the insulating portions 15 are prevented from being charged up, and the electrostatic field in the aperture 12 can be precisely controlled according to the voltages applied to the respective conductive films 21.

Since the voltage-applying wires 17 are coupled to the corresponding conductive films 23 from the outside surface 11d of the cylindrical member 11, the coatings of the voltage-applying wires 17 are also prevented from being viewed from the electron beam passing the aperture 12.

According to the fabrication method of the electrostatic deflector 10 in the present embodiment, the wiring conductive films 22, 23 can also be formed at the same time as the formation of the electrode conductive films 21, which can decrease the fabrication cost.

It is also possible to readily fabricate many electrostatic deflectors 10 by first fabricating a cylindrical base 11 in a constant cross-sectional shape and thereafter cutting the base 11 perpendicularly to the center axis Z.

(Second Embodiment)

Next described is the charged particle beam control element according to the second embodiment of the present invention. The charged particle beam control element 30 according to the second embodiment is also an electrostatic quadrupole deflector wherein continuous conductive films 31 to 34 are formed at four locations on the internal surface of the cylindrical member 36, similar to the electrostatic deflector 10 of the first embodiment described above.

The structure of the cylindrical member 36 is the same as the cylindrical member 11 described above and is thus provided with the aperture 12, the four bent grooves 13, and the four screw holes 14. Among the internal surface of the cylindrical member 36, the internal surface 13b in the deepest area of each bent groove 13 is the insulating portion 15 similar to those described above and the continuous conductive films 31 to 34 are formed on the other internal surfaces 11c, 13a, 13c, 14a.

Figure 5:
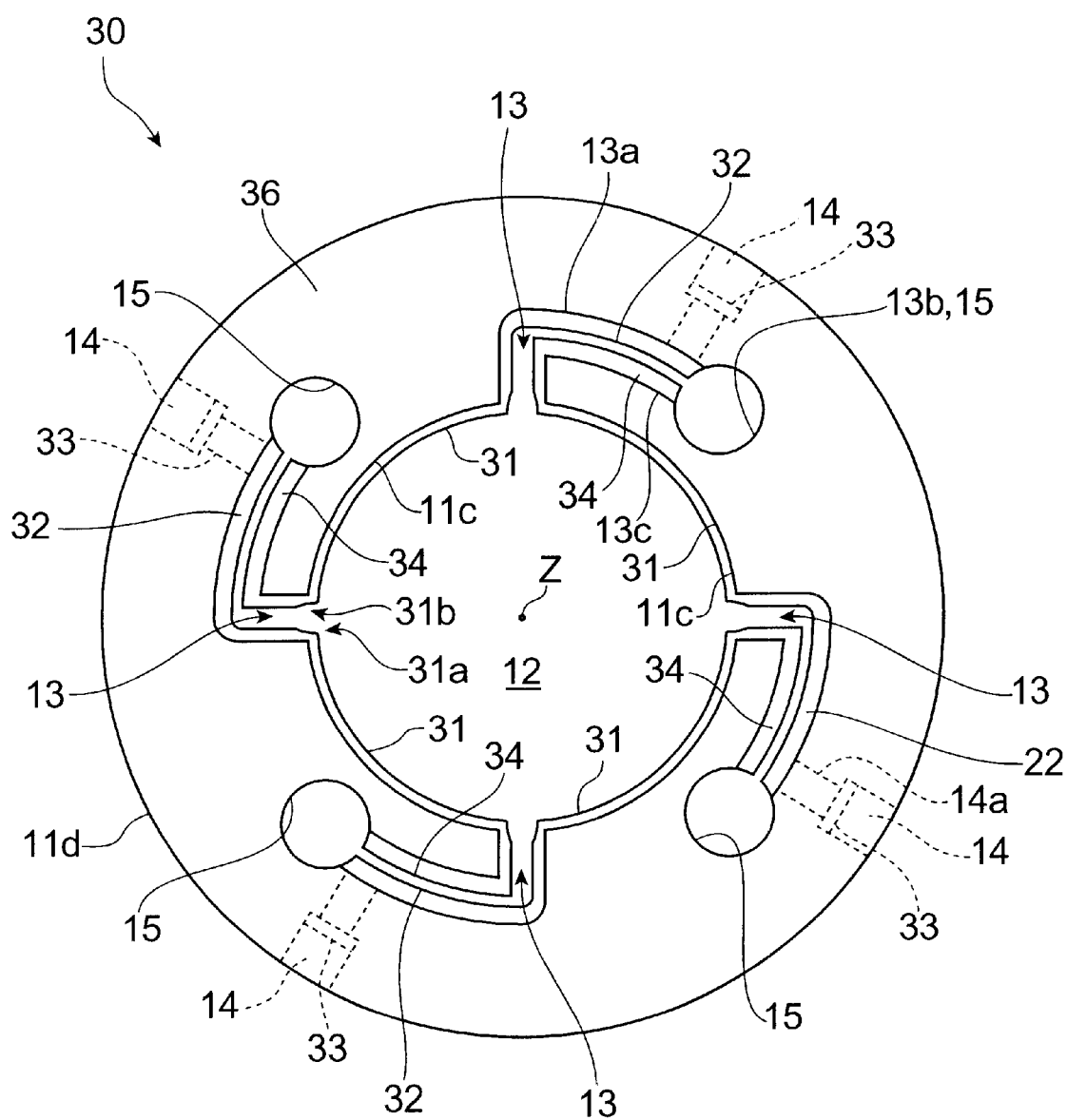
FIG. 5 is a top plan view of the electrostatic deflector 30 in the second embodiment.

The feature of the electrostatic deflector 30 according to the second embodiment is the continuous conductive films 31 to 34. Among the continuous conductive films 31 to 34, the conductive film 31 on the internal surface 11c is processed by high precision working (described hereinafter) and the conductive films 32 to 34 on the internal surfaces 13a, 13c, 14a have greater thickness, as illustrated in FIG. 5.

Figure 6A:
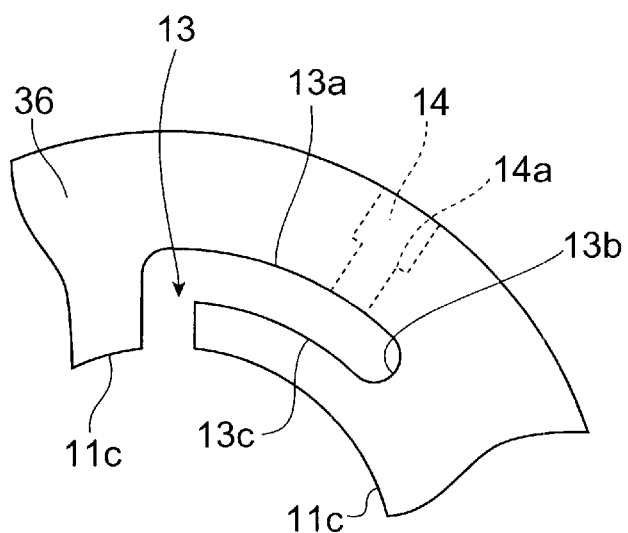
FIG. 6A is a diagram to illustrate the fabrication process of the electrostatic deflector 30.

Next, the fabrication process of the electrostatic deflector 30 will be described below. First, the cylindrical member 36 with the aperture 12, four bent grooves 13, and four screw holes 14 is made by blank working (see FIG. 6A) similar to that in the fabrication method of the electrostatic deflector 10 according to the first embodiment described above (reference is also made to FIG. 3).

Figure 6B:
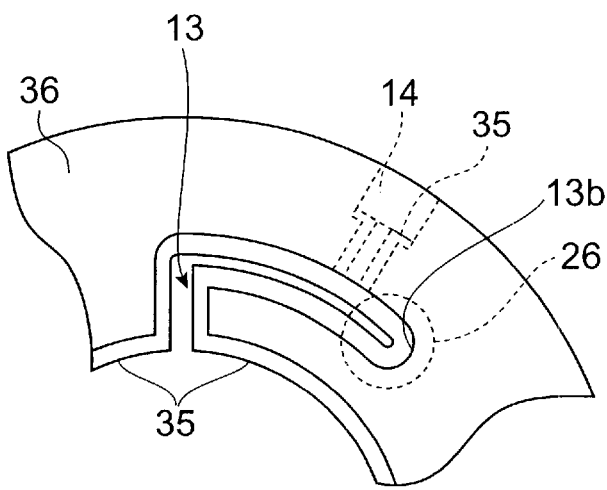
FIG. 6B is a diagram to illustrate the fabrication process of the electrostatic deflector 30.

Then the surface treatment by electroless plating over the cylindrical member 36 thus obtained is carried out up to greater thickness than in the case of the electrostatic deflector 10 according to the first embodiment. As a result, a thick conductive film 35 is uniformly formed on the internal surface 11c of the cylindrical member 36, the internal surfaces 13a to 13c of the four bent grooves 13, and the internal surfaces 14a of the four screw holes 14 (see FIG. 6B). For making the thickness of the conductive film 35 thicker by this surface treatment, it is preferable to place electroless nickel plating as an undercoat and further place gold plating.

Figure 6C:
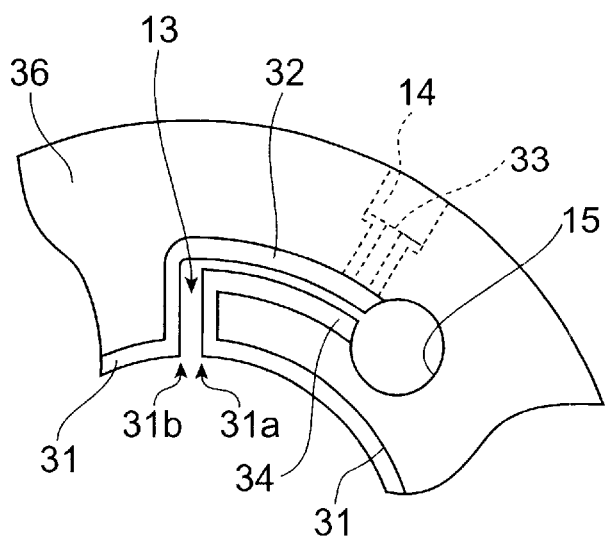
FIG. 6C is a diagram to illustrate the fabrication process of the electrostatic deflector 30.

In the next step, the area near the deepest area 26 of each bent groove 13 is subjected to machining or electric discharge machining to remove the conductive film 35 formed on the internal surface 13b. As a result, the internal surface 13b of each bent groove 13 turns to an insulating portion 15 (see FIG. 6C), so that the conductive film 35 is divided into four electrodes electrically isolated from each other. Namely, the continuous conductive films 31 to 34 are formed at four locations on the internal surface of the cylindrical member 36.

In the final step, the conductive films 31 formed on the internal surface 11c of the cylindrical member 36 are subjected to the high precision working by machining or by electric discharge machining. Specifically, the circularity, diameter, and eccentricity of the aperture 12 are adjusted by the high precision working over the surfaces (electrode surfaces) of the conductive films 31. Further, one end 31a and another end 31b (electrode dividing portions) of the conductive films 31 are processed by the high precision working to adjust coordinates thereof.

Accordingly, the electrostatic deflector 30 according to the second embodiment (see FIG. 5) can be constructed with higher dividing angle accuracy of the conductive films 31 for the electrodes and with higher circularity of the surfaces of the conductive films 31. As a consequence, the electrostatic field can be established with high accuracy in the aperture 12.

Incidentally, ceramic insulators before baking are generally easier to process, but high dimensional accuracy cannot be expected for the cylindrical member 36 itself, because they expand and contract during the baking. It is also very difficult to accurately control the coordinates of one end 31a and another end 31b of the conductive films 31 at the stage of the surface treatment.

For this reason, the conductive films 31 for the electrodes are fabricated readily at low cost, with high dividing angle accuracy, with high circularity of surface, and with high accuracy by the fabrication method of the electrostatic deflector 30 according to the second embodiment including the steps of preliminarily performing the surface treatment to greater thickness and then processing the conductive films 31 by the high precision working after the surface treatment.

The first embodiment and the second embodiment above described the examples of the wiring structure wherein each screw hole 14 penetrated the cylindrical member up to the bent groove 13 and wherein the conductive film 23 (33) on the internal surface 14a of each screw hole 14 was electrically connected to the conductive film 22 (33) on the internal surface 13a of the corresponding bent groove 13, but the wiring structure does not have to be limited to this structure.

Figure 7:
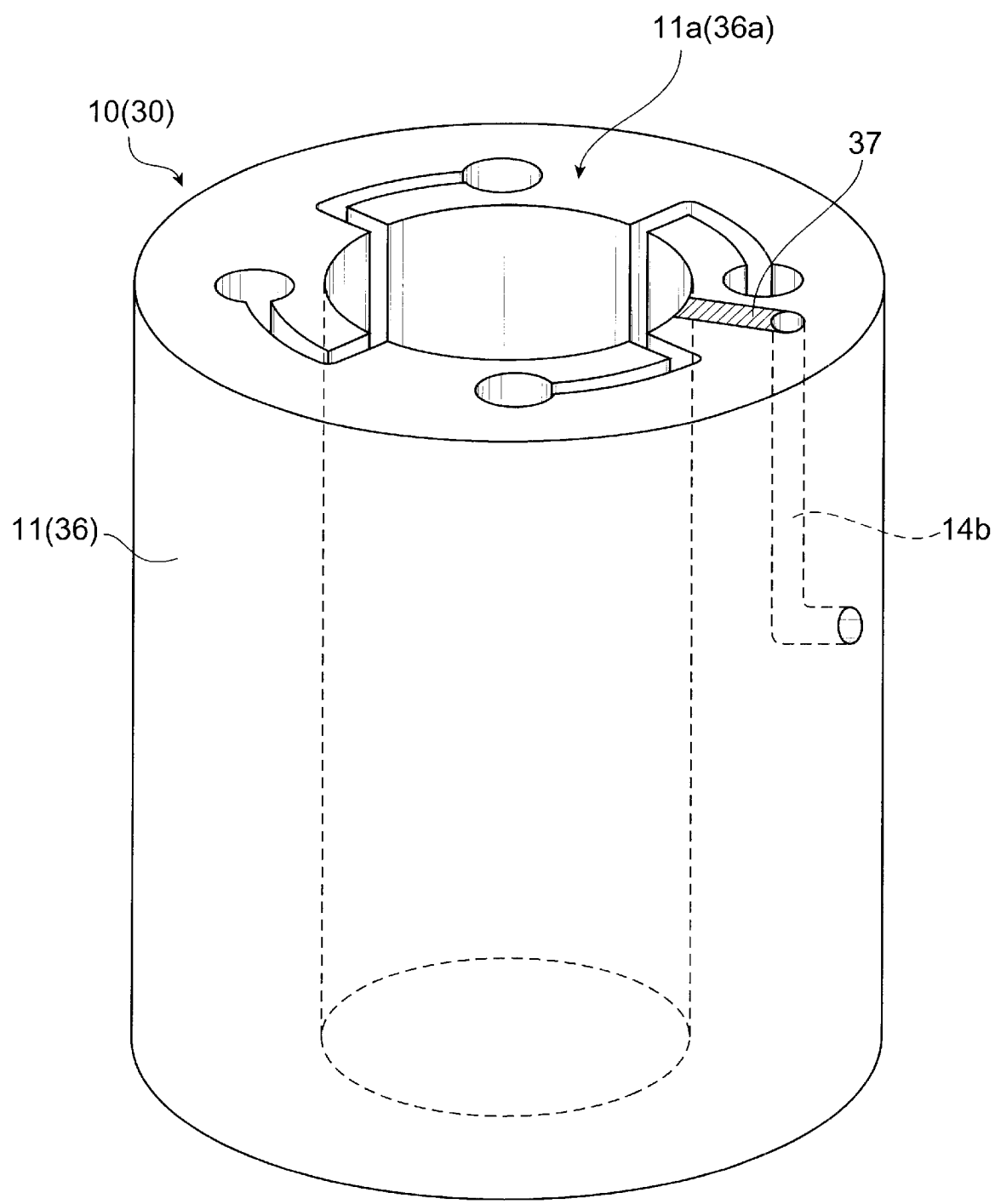
FIG. 7 is a perspective view to show a modification of the electrostatic deflector.

For example, another example can be wiring structure as illustrated in FIG. 7 wherein a new conductive film 37 extending from a conductive film 21 (31) for electrode is laid on the end face 11a of the cylindrical member 11 (36), an L-shaped screw hole 14b penetrating the cylindrical member between the end face 11a and the outer surface 11d is formed through the cylindrical member, and a conductive film 37 formed on the internal surface of this L-shaped screw hole 14b is electrically connected to the conductive film on the end face 11a.

The above embodiments described the elements for controlling the trajectory of the electron beam (the electrostatic deflectors 10, 30), but they can also be applied to stigmators (astigmatism correctors) for controlling the cross-sectional shape of the electron beam to effect shaping, by changing the polarities of the voltages applied to the respective conductive films 21 (31) in the same structure as the elements.

(Third Embodiment)

Next described is the charged particle beam control element according to the present third embodiment. The third embodiment concerns an electrostatic element 40 that controls the cross-sectional shape of the electron beam to focus the electron beam (which will be referred to hereinafter as "electrostatic lens").

Figure 8:
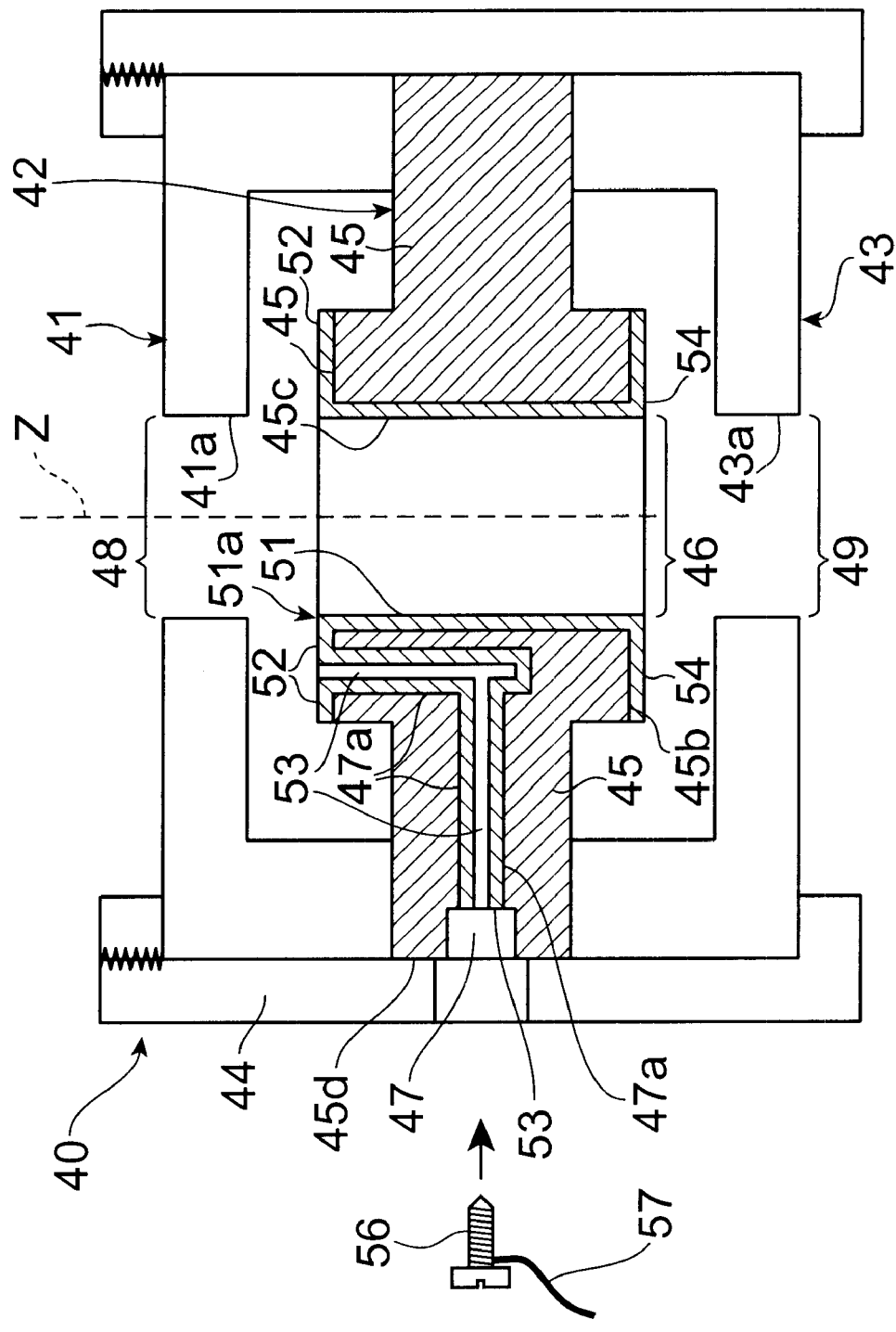
FIG. 8 is a cross-sectional view of the electrostatic lens 40 in the third embodiment.

The electrostatic lens 40 is a rotationally symmetric, electrostatic lens 40 in which three electrode portions 41, 42, 43 are arranged in order along the center axis Z, as illustrated in the cross-sectional view of FIG. 8. The three electrode portions 41 to 43 are housed in a cylindrical body 44.

Figure 9:
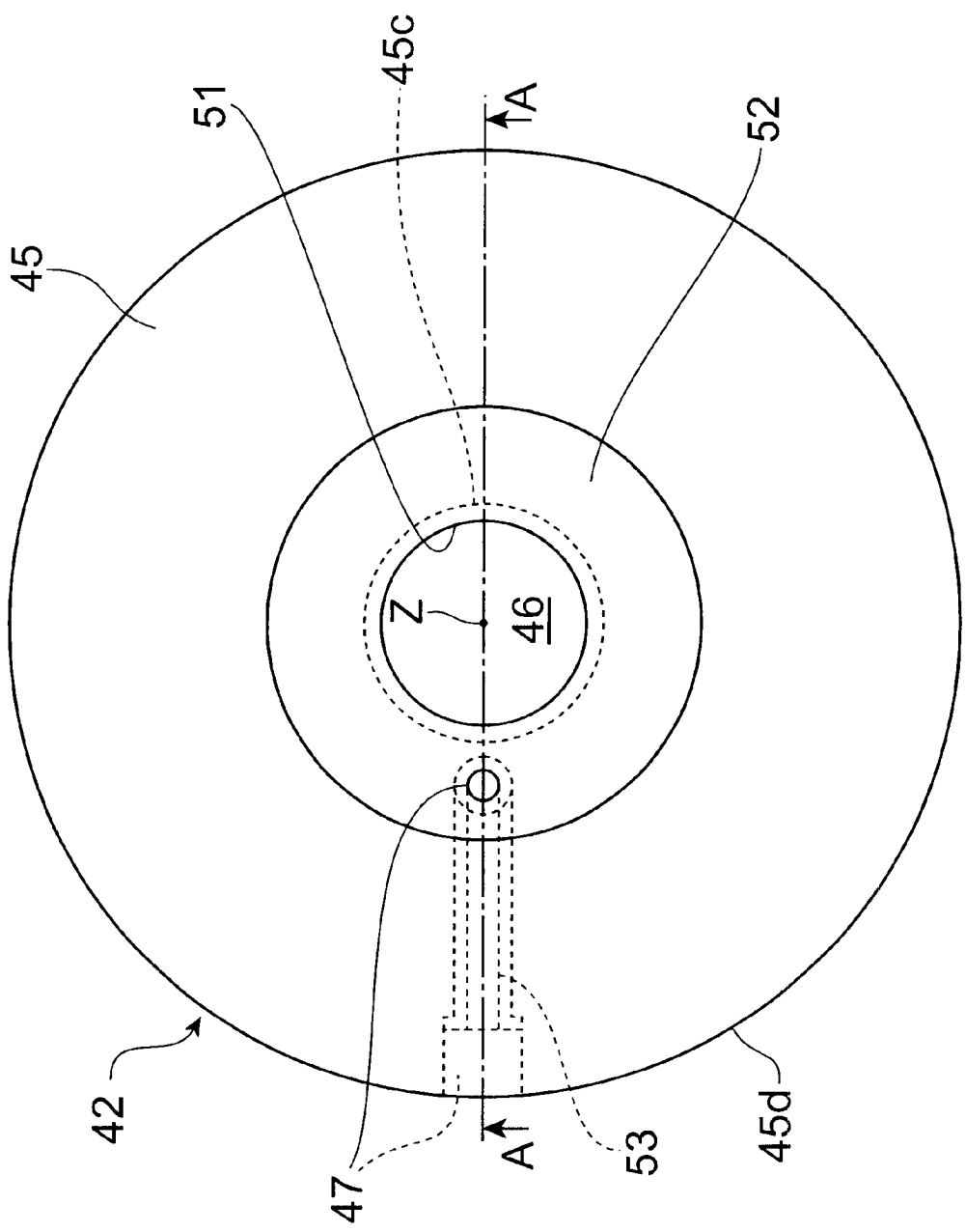
FIG. 9 is a top plan view of the electrode portion 42 constituting the electrostatic lens 40.

Described hereinafter is the center electrode portion 42 forming the electrostatic lens 40. FIG. 9 is a top plan view of the electrode portion 42. The electrode portion 42 illustrated in FIG. 8 corresponds to an A—A cross section of FIG. 9.

The electrode portion 42 is a portion formed by laying continuous conductive films 51 to 54 of an electric conductor on a cylindrical member 45 (base) of an electric insulator.

First described is the structure of the cylindrical member 45. The cylindrical member 45 is provided with an aperture 46 of a circular cross section. The aperture 46 penetrates the cylindrical member 45 along the center axis Z between one end face 45a and the other end face 45b thereof. The aperture 46 corresponds to the space surrounded by the internal surface 45c of the cylindrical member 45. Further, the cylindrical member 45 is provided with an L-shaped screw hole 47 (through hole) penetrating the inside of the cylindrical member 45 from one end face 45a thereof up to the outer surface 45d.

Next described are the continuous conductive films 51 to 54 formed on the cylindrical member 45 of the above structure. The conductive film 51 formed on the internal surface 45c of the cylindrical member 45 functions as an electrode for generating the electrostatic field in the aperture 46. The conductive film 52 formed on the end face 45a so as to extend from one end 51a of the conductive film 51 functions as a wire for applying the voltage to the conductive film 51. Further, the conductive film 53 formed on the internal surface 47a of the screw hole 47 so as to extend from the conductive film 52 functions as a wire for applying the voltage to the above-described conductive film 51 as the conductive film 52 does.

The electrode portion 42 in this structure is fabricated through the process similar to that of the electrostatic deflector 10 according to the first embodiment described above. Namely, a solid ceramic insulator is first formed and then the formed ceramic insulator is baked to obtain the cylindrical member 45 provided with the aperture 46 and screw hole 47. Then the surface treatment by electroless plating is performed over the cylindrical member 45 of the above structure. As a result, the continuous conductive films 51 to 54 are formed on the internal surface 45c and end faces 45a, 45b of the cylindrical member 45 and on the internal surface 47a of the screw hole 47, thus completing the electrode portion 42.

Since in this electrode portion 42 the above conductive film 53 is formed on the internal surface 47a of the screw hole 47, the voltage-applying wire 57 from the outside can be connected to the conductive film 53 by putting a wiring screw 56 into this screw hole 47 and tightening it. At this time, the voltage-applying wire 57 from the outside is connected through the conductive film 53 of the screw hole 47 and the conductive film 52 of the end face 45a to the conductive film 51 on the internal surface 45c. When in this connection state the predetermined voltage is applied from the outside to the conductive film 51, the predetermined electrostatic field can be established according to the voltage applied to the conductive film 51, in the aperture 46.

The two outside electrode portions 41, 43 forming the electrostatic lens 40 are made all of metal and each of the electrode portions 41, 43 is provided with an aperture 48 or 49. In each of the electrode portions 41, 43, the metal part located at the internal surface 41a, 43a surrounding the aperture 48, 49 functions as an electrode for establishing the electrostatic field in the aperture 48, 49.

In the electrostatic lens 40 constructed as described above, the electron beam passing along the center axis Z in the apertures 48, 46, 49 can be focused or diverged, for example, by applying the predetermined voltage (≠0) to the conductive film 51 of the center electrode portion 42 and setting the outside electrode portions 41, 43 at the zero potential.

As described above, the electrostatic lens 40 according to the third embodiment is constructed in the structure in which the conductive film 52 for wiring is placed on the end face 45a of the cylindrical member 45 and the conductive film 53 for wiring on the internal surface 47a of the screw hole 47 (inside the cylindrical member 45), which can simplify the wiring structure to the conductive film 51 for electrode.

The electrostatic lens 40 can be constructed in reduced size, because there is no need for provision of an extra space for the wiring structure to the conductive film 51.

Further, the fabrication cost can be reduced, because the conductive films 52, 53 for wiring can also be formed at the same time as the formation of the electrode conductive film 51.

Electric conduction can be readily established between the voltage-applying wire 57 and the electrode conductive film 51 by simply fastening the wire with the wiring screw 56. It is also free to attach or detach the voltage-applying wire 57.

Further, since the wiring conductive film 52 is connected to one end 51a of the electrode conductive film 51, the surface of the electrode conductive film 51 is prevented from being perforated, whereby the surface (electrode surface) of the conductive film 51 can be kept with high accuracy. Accordingly, the electrostatic field without distortion can be established with high accuracy in the aperture 46.

Since the connection between the wiring conductive film 53 and the conductive film 52 is located in the region off direct view from the electron beam passing the aperture 46, the electrostatic field can be created with higher accuracy in the aperture 46.

Further, since the voltage-applying wire 57 is coupled to the conductive film 53 from the external surface 45d of the cylindrical member 45, the coating of the voltage-applying wire 57 is not viewed from the electron beam passing the aperture 46.

Since the cylindrical member 45 of the center electrode portion 42 is the insulator, the three electrode portions 41 to 43 can be electrically isolated from each other by placing the outside electrode portions 41, 43 in abutment with exposed portions of the insulator. For this reason, there is no need to interpose an insulating member between the electrode portions 41, 42 and between the electrode portions 42, 43, whereby the electrostatic lens 40 can be constructed in reduced size.

For fabricating the electrostatic lens 40 of the third embodiment, if the surface treatment is performed to greater thickness over the cylindrical member 45 and then the conductive film 51 is subjected to the high precision working after the surface treatment as in the case of the fabrication method of the electrostatic deflector 30 of the second embodiment described above, the electrode conductive film 51 can be obtained readily at low cost, with higher circularity of surface, and with high accuracy.

The above electrostatic lens 40 of the third embodiment was described as an example of the wiring structure wherein the wiring conductive film 52 was formed on the end face 45a of the cylindrical member 45, the L-shaped screw hole 47 was formed so as to penetrate the cylindrical member between the end face 45a and the external surface 45d, and the conductive film 53 formed on the internal surface 47a of this L-shaped screw hole 47 was connected to the conductive film 52 of the end face 45a, but the wiring structure does not have to be limited to this structure. For example, the wiring structure may be such that a new conductive film is formed so as to extend from the conductive film 52 formed on the end face 45a of the cylindrical member 45 and electric conduction with the conductive film 53 of the screw hole 47 is established by making use of the new conductive film.

Further, the above electrostatic lens 40 of the third embodiment was the example of the electrostatic lens 40 in the structure in which the outside electrodes 41, 43 were made all of metal, but these electrode portions 41, 43 may also be made in the structure similar to the center electrode portion 42.

Next described is a charged particle beam apparatus according to the present invention. The charged particle beam apparatus concerns an electrons beam (EB) inspection system 60 using the above-described electrostatic deflector 10 (FIG. 1 and FIG. 2), electrostatic deflector 30 (FIG. 5), and electrostatic lens 40 (FIG. 8 and FIG. 9).

Figure 10:
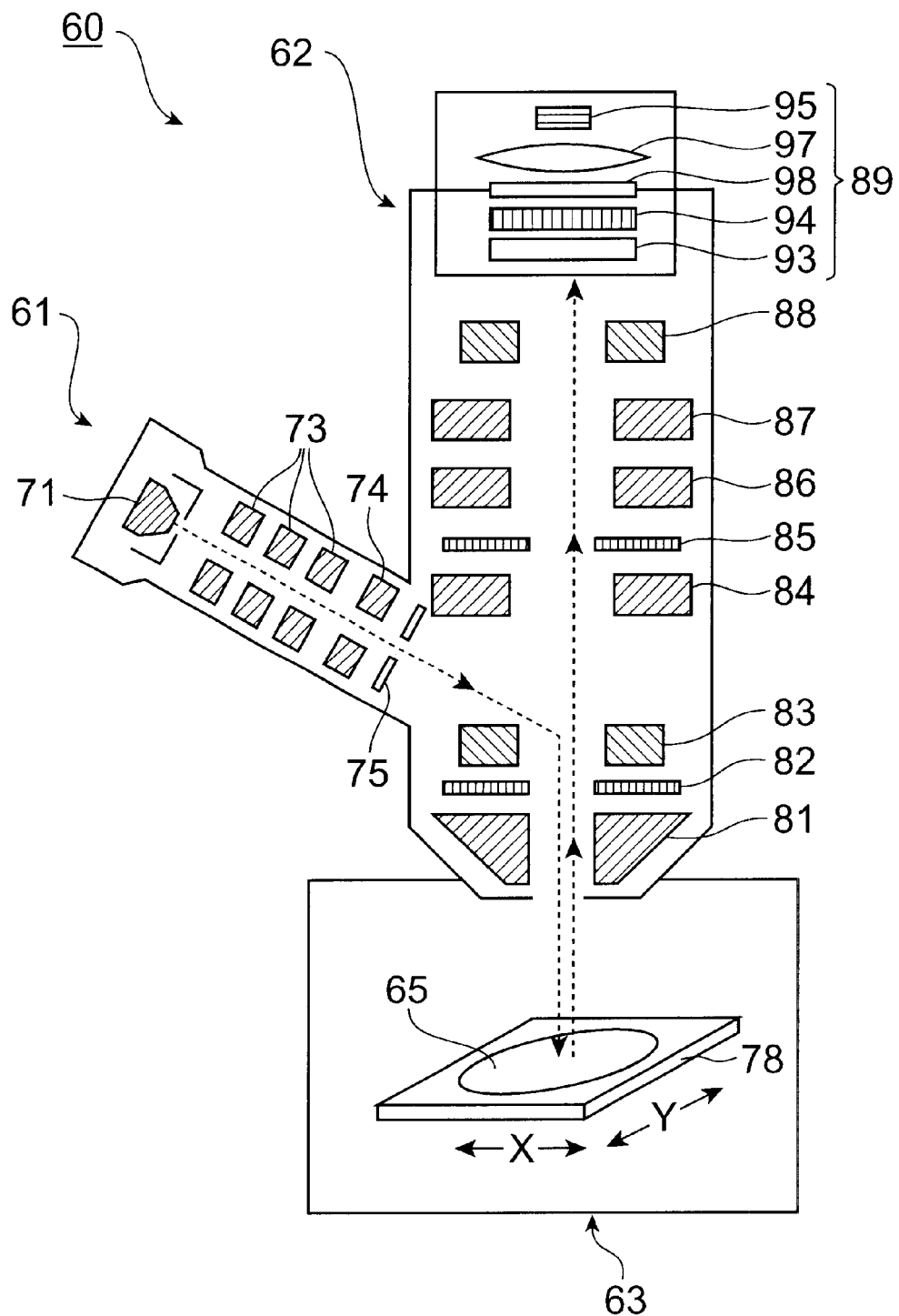
FIG. 10 is a diagram to show the overall structure of an EB inspection system 60 in the fourth embodiment.
Figure 11:
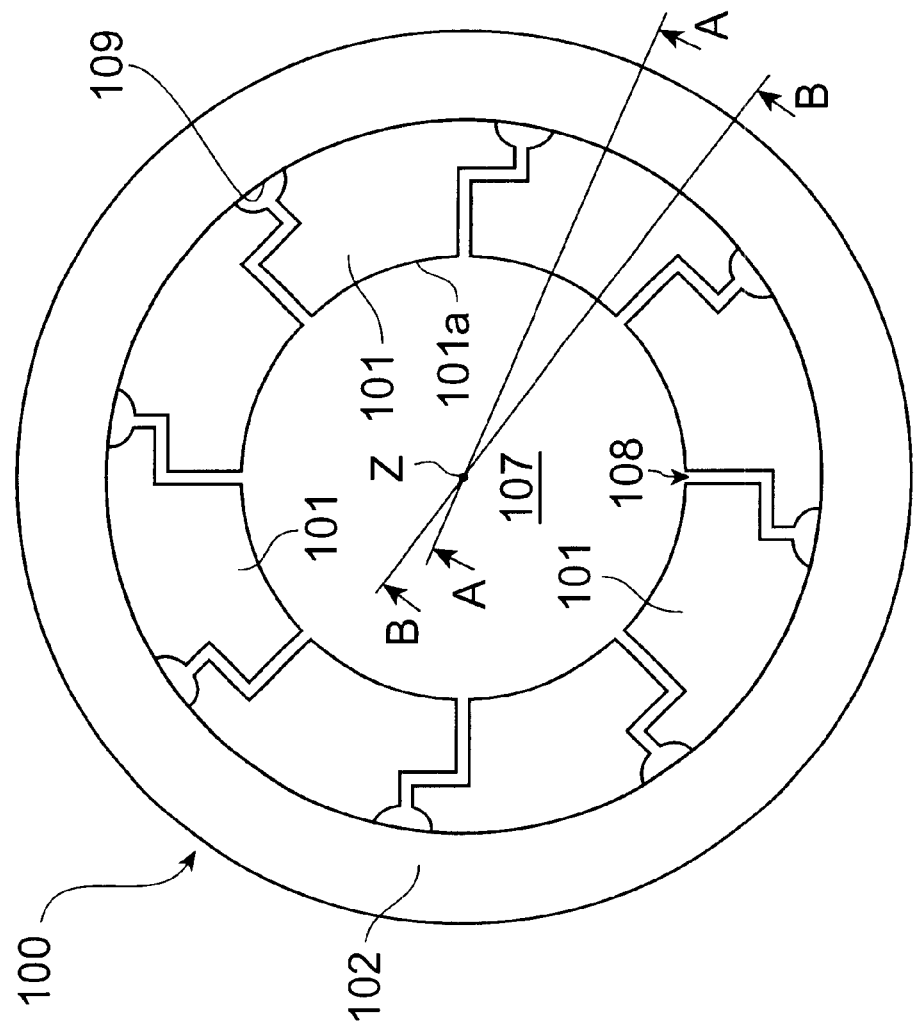
FIG. 11 is a top plan view of the conventional electrostatic deflector 100.
Figure 12A:
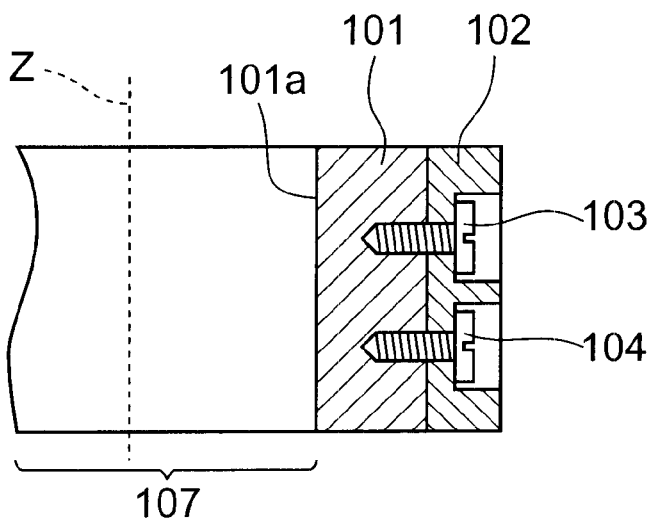
FIG. 12A is an A—A cross-sectional view of the electrostatic deflector 100 illustrated in FIG. 11.
Figure 12B:
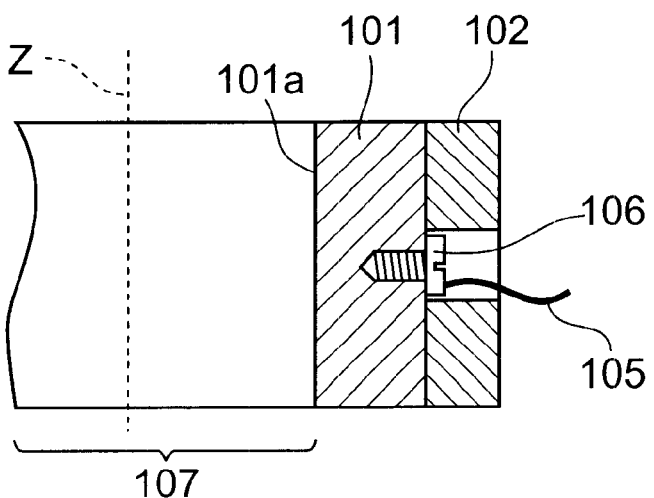
FIG. 12B is a B—B cross-sectional view of the electrostatic deflector 100 illustrated in FIG. 11.

The EB inspection system 60 is comprised of a primary column 61, a secondary column 62, and a chamber 63, as illustrated in FIG. 10. Among these, the primary column 61 is obliquely attached to the side face of the secondary column 62. The chamber 63 is attached to the bottom of the secondary column 62. These primary column 61, secondary column 62, and chamber 63 are evacuated by a turbo pump of an evacuation system (not illustrated), whereby the inside is maintained in a vacuum state.

Each of structures of the primary column 61, secondary column 62, and chamber 63 will be described hereinafter.

[Primary Column]

An electron gun 71 is placed inside the primary column 61. The electron gun 71 acts to accelerate and focus thermoelectrons emitted from the cathode and emit them in the form of an electron beam. The cathode of this electron gun 71 is normally a rectangular cathode and is made of lanthanum hexaboride ($LaB_6$) capable of emitting a large current.

A primary optical system 73, a primary deflector 74, and an aperture 75 are placed on the optical axis of the electron beam emitted from the electron gun 71 (which will be referred to hereinafter as "primary beam").

The primary optical system 73 is composed, for example, of three stages of the electrostatic lenses 40 described above (FIG. 8 and FIG. 9). By optimizing lens voltages to the respective electrostatic lenses 40, the primary optical system 73 can shape the cross section of the primary beam into any desired shape (e.g., a surface shape such as a rectangular shape, an elliptic shape, or the like) without loss of emitted electrons.

The primary deflector 74 is constructed of either the electrostatic deflector 10 (FIG. 1 and FIG. 2) or the electrostatic deflector 30 (FIG. 5) described above. The primary deflector 74 can deflect the trajectory of the primary beam in the X-direction or in the Y-direction. The electron gun 71, primary optical system 73, primary deflector 74, and aperture 75 in the primary column correspond to the "irradiation means" in the claims.

[Chamber]

A stage 78, on which a sample 65 is to be mounted and which is movable in the X- and Y-directions, is installed inside the chamber 63. A predetermined retarding voltage Vr (which will be described hereinafter) is applied to this stage 78.

[Secondary Column]

Inside the secondary column 62, there are a cathode lens 81, a numerical aperture 82, a Wien filter 83, a second lens 84, a field aperture 85, a third lens 86, a fourth lens 87, a secondary deflector 88, and a detector 89 placed on the optical axis of a secondary beam (described hereinafter) emerging from the sample 65.

Among these, the cathode lens 81 is composed of three electrode portions 41 to 43 similar to the electrostatic lens 40 described above (FIG. 8 and FIG. 9). In this case, a predetermined voltage is applied to the first electrode portion and to the second electrode portion, when counted from the bottom (the side of the sample 65) of the cathode lens 81, and the third electrode portion is set to the zero potential.

The numerical aperture 82 corresponds to an aperture stop and determines the angular aperture of the above cathode lens 81. The shape thereof is a thin film plate of metal (Mo or the like) perforated with a circular opening. The numerical aperture 82 is placed so that the aperture portion thereof is at the focus position of the cathode lens 81. Therefore, the numerical aperture 82 and the cathode lens 81 compose a telecentric electron-optical system.

The Wien filter 83 is a deflector acting as an electromagnetic prism and allows charged particles (e.g., the secondary beam) satisfying the Wien condition (E=vB where v is the velocity of charged particles, E the electric field, B the magnetic field, and E⊥B) to travel straight, but bends the trajectory of the other charged particles (e.g., the primary beam).

Each of the second lens 84, the third lens 86, and the fourth lens 87 is constructed of the electrostatic lens 40 described above (FIG. 8 and FIG. 9).

The field aperture 85 is placed between the second lens 84 and the third lens 86 and limits the field to a necessary range as the field stop of optical microscope does.

The secondary deflector 88 is an electrostatic deflector capable of biaxial deflection, similar to the primary deflector 74 described above. This secondary deflector 88 can deflect the trajectory of the secondary beam in the X-direction or in the Y-direction.

The detector 89 is composed of an MCP (microchannel plate) 93 for accelerating and multiplying electrons, a fluorescent screen 94 for converting an electron image into an optical image, and a TDI (Time Delay and Integration) array CCD sensor (hereinafter referred to as "TDI sensor") 95 for picking up the optical image.

An optical relay lens 97 is placed between the fluorescent screen 94 and the TDI sensor 95 to demagnify the optical image at the fluorescent screen 94 into about one third and project the reduced image onto an image pickup surface of the TDI sensor 95. A view port 98 as a transmissive window to transmit the optical image is located between the fluorescent screen 94 and the optical relay lens 97. This view port 98 separates a vacuum chamber and an air chamber from each other inside the detector 89.

Next, the trajectories of the primary beam and the secondary beam in the EB inspection system 60 will be described in order.

[Primary Beam]

The primary beam outputted from the electron gun 71 passes under the lens action of the primary optical system 73 to reach the first deflector 74. When no voltage is applied to the primary deflector 74, the primary beam successively passes the primary deflector 74 and the aperture 75 to be obliquely incident to the center part of the Wien filter 83.

The deflecting action of the Wien filter 83 bends the trajectory of the primary beam incident to the Wien filter 83 and then the primary beam reaches the aperture part of the numerical aperture 82. At this time, the primary beam is focused at the aperture part of the numerical aperture 82.

Since the numerical aperture 82 and the cathode lens 81 compose the telecentric electron-optical system, the primary beam focused at the aperture part of the numerical aperture 82 passes the cathode lens 81 to become a parallel beam and the parallel beam impinges normally and uniformly onto the surface of the sample 65. Namely, the Köhler illumination in the field of optical microscope is implemented.

The retarding voltage Vr is applied to the stage 78 carrying the sample 65 and a negative electric field to the primary beam is established between the cathode lens 81 and the sample 65. Therefore, the primary beam passing the cathode lens 81 is decelerated before it reaches the surface of the sample 65.

On the other hand, the shape of the primary-beam-irradiating region on the surface of the sample 65 is shaped into any desired shape (e.g., a surface shape such as a rectangular shape, an elliptic shape, or the like) by controlling the lens voltages to the primary optical system 73. XY positions of the primary-beam-irradiating region can be moved on the sample 65 by controlling the voltage applied to the primary deflector 74 so as to deflect the primary beam.

[Secondary Beam]

When the primary beam impinges upon the sample 65, the secondary beam consisting of at least either of secondary electrons, reflected electrons, and backwardly scattered electrons is generated from the inside of the irradiated area. This secondary beam includes two-dimensional image information of the irradiated area. Since the primary beam impinges normally upon the surface of the sample 65 as described above, the two-dimensional image of the irradiated area is a clear image without a shadow.

Since the retarding voltage Vr is applied to the stage 78 carrying the sample 65, a positive electric field to the secondary beam is established between the sample 65 and the cathode lens 81. Therefore, the secondary beam generated from the sample 65 is accelerated toward the cathode lens 81.

Then the secondary beam experiences the focusing action of the cathode lens 81, travels through the numerical aperture 82, goes straight without undergoing the deflecting action of the Wien filter 83, and travels through the second lens 84 to be focused at the aperture part of the field aperture 85.

By changing the electromagnetic field applied to the Wien filter 83, only electrons with energy in a specific energy band (for example, the secondary electrons, reflected electrons, or backwardly scattered electrons) can be selectively made to pass, among the incident secondary beam.

The secondary beam passing through the field aperture 85 undergoes repetitive focusing and divergence by the third lens 86 and the fourth lens 87 placed in the post stage, and then travels through the secondary deflector 88 to be refocused on the detection surface of the detector 89.

Further, the secondary beam refocused on the detection surface of the detector 89 is accelerated and multiplied during passage through the MCP 93 in the detector 89, and is converted into light in the fluorescent screen 94. Then the light from the fluorescent screen 94 is focused through the optical relay lens 97 on the image pickup surface of the TDI sensor 95.

As described above, the intermediate image of the irradiated area formed at the aperture part of the field aperture 85 is enlargedly projected through the third lens 86 and the fourth lens 87 onto the detection surface of the detector 89, the refocused image is converted into the optical image in the fluorescent screen 94, and thereafter the optical image is projected onto the image pickup surface of the TDI sensor 95.

The detector 89 acquires the image of the sample, based on an output signal from the TDI sensor 95, and carries out template matching or the like for this sample image to specify a defective location in the sample 65.

In the EB inspection system 60 according to the fourth embodiment of the present invention, as described above, it is feasible to decrease the size and cost of the electron beam control elements including the primary optical system 73, primary deflector 74, cathode lens 81, second lens 84, third lens 86, fourth lens 87, and secondary deflector 88, and the wiring structures of the electron beam control elements are also simplified; therefore, degrees of freedom for design are increased. Further, it is also feasible to control the trajectories of the primary beam and the secondary beam with high accuracy.

If a stigmator is placed in the secondary column 62 of the above EB inspection system 60, the stigmator can be of the same structure as the electrostatic deflector 10 (FIG. 1 and FIG. 2) or the electrostatic deflector 30 (FIG. 5) described above.

The above fourth embodiment described, the EB inspection system 60 wherein the cathode lens 81, the Wien filter 83, etc. were shared between the path of the primary beam up to the irradiation on the sample 65 (the primary beam system) and the path of the secondary beam from the sample 65 up to the arrival at the detector 89 (the secondary beam system), whereas another inspection system may also be constructed in such structure that the primary beam system and the secondary beam system are made independent of each other and provided with their respective cathode lenses.

Further, the present invention is not limited only to the apparatus for inspecting the sample with the primary beam shaped in the surface shape, but it is also applicable to apparatus for inspecting the sample with the primary beam focused in a spot shape. The present invention can also be applied to electron beam apparatus including EB exposure systems, EB drawing systems, and so on, without having to be limited to the EB inspection systems. The present invention can also be applied to elements for controlling the trajectory of charged particle beams (ion beams or the like) other than the electron beam, and to charged particle beam apparatus using such elements.

As described above, the present invention permits the voltage-applying wire to be connected to the electrode in the simple structure while maintaining the high accuracy of the surface of the electrode formed on the insulator by the surface treatment of plating or the like, and thus the invention can realize both the decrease in the size and cost of the charged particle beam control element and charged particle beam apparatus and the high-accuracy control of the trajectory of the charged particle beam.

What is claimed is:

1. A charged particle beam control element for controlling a trajectory of a charged particle beam by an electrostatic field, comprising:

an insulating base having a plurality of electrode portions formed on an internal surface thereof; and insulating portions, which are disposed at respective locations not exposed to a passing area of said charged particle beam surrounded by said internal surface, separating said electrode portions from each other.

2. A charged particle beam control element according to claim 1, wherein a plurality of grooves extending from one end to the other end of said base are formed on said internal surface, and wherein a cross-sectional shape of each said groove is bent and said insulating portion is formed in a deepest area of said groove.

3. A charged particle beam control element according to claim 2, wherein a through hole is formed so as to penetrate the base between a peripheral surface of said base and said groove and an electroconductive portion is formed on an internal surface of said through hole.

4. A charged particle beam control element according to claim 3, wherein said through hole is not exposed to the passing area of said charged particle beam.

5. A method of fabricating a charged particle beam control element for controlling a trajectory of a charged particle beam by an electrostatic field, said method comprising:

a groove forming step of forming on an internal surface of an insulating base, a groove extending from one end to the other end of said base and having a bent cross-sectional shape;

a conductive member depositing step of depositing an electroconductive member on said internal surface including said groove; and an insulating portion forming step of forming an insulating portion by removing the electroconductive member deposited in a deepest area of said groove, from one end toward the other end of said base.

6. A method according to claim 5, further comprising a conductive member grinding step of grinding a surface of the electroconductive member deposited on said internal surface so that the cross-sectional shape of said internal surface becomes complete round, after said conductive member depositing step.

7. A method according to claim 5, further comprising a conductive member grinding step of grinding a surface of the electroconductive member deposited on said groove in order to adjust a position of an electrode portion, after said conductive member depositing step.

8. A method according to claim 5, further comprising a through hole forming step of forming a through hole penetrating the base between a peripheral surface of said base and said groove, between said groove forming step and said conductive member depositing step.

9. A charged particle beam control element comprising:

an insulating base having an electrode portion formed on an internal surface thereof;

a first electroconductive member placed on an internal surface of a communicating hole formed so as to establish communication between one end of said base and a through hole for fixing said base, formed in a peripheral surface of said base; and a second electroconductive member placed on said one end of said base so as to connect said first electrodconductive member with said electrode portion.

10. A charged particle beam apparatus comprising:

the charged particle beam control element as set forth in claim 1; and irradiation means for implementing irradiation with a charged particle beam controlled by said charged particle beam control element.

* * * * *